(12) United States Patent
Wang et al.

(10) Patent No.: US 10,101,518 B2
(45) Date of Patent: Oct. 16, 2018

(54) INTEGRATED BACK LIGHT UNIT

(71) Applicant: GLO AB, Lund (SE)

(72) Inventors: Ping Wang, Sunnyvale, CA (US);
Douglas Harvey, Santa Clara, CA (US); Tyler Kakuda, Sunnyvale, CA (US); Ronald Kaneshiro, Los Altos, CA (US)

(73) Assignee: GLO AB, Lund (SE)

( * ) Notice: Subject to any disclaimer, the term of this patent is extended or adjusted under 35 U.S.C. 154(b) by 442 days.

(21) Appl. No.: 14/493,129

(22) Filed: Sep. 22, 2014

(65) Prior Publication Data
US 2015/0085521 A1 Mar. 26, 2015

Related U.S. Application Data

(60) Provisional application No. 61/881,037, filed on Sep. 23, 2013, provisional application No. 61/894,466, (Continued)

(51) Int. Cl.
*F21V 7/04* (2006.01)
*F21V 8/00* (2006.01)
(Continued)

(52) U.S. Cl.
CPC ............. *G02B 6/0023* (2013.01); *F21K 9/90* (2013.01); *F21V 19/002* (2013.01); *F21V 19/0025* (2013.01); *G02B 6/0003* (2013.01); *G02B 6/005* (2013.01); *G02B 6/0031* (2013.01); *G02B 6/0055* (2013.01); *G02B 6/0073* (2013.01); *H01L 21/4821* (2013.01); *H01L 22/10* (2013.01); *H01L 33/52* (2013.01);
(Continued)

(58) Field of Classification Search
CPC ........ F21K 9/00; F21K 19/001; F21K 19/002; F21K 19/0025; F21K 19/003; F21K 19/0035; G02B 6/0003; G02B 6/0023; G02B 6/0031; G02B 6/0041; G02B 6/005; G02B 6/0055; H01L 22/10; H01L 33/52
USPC ...................... 362/97.3, 249.02, 311.02, 612
See application file for complete search history.

(56) References Cited

U.S. PATENT DOCUMENTS 7,083,317 B2 * 8/2006 Higashiyama ....... G02B 6/0021
362/612
7,607,814 B2 10/2009 Destain
(Continued)

FOREIGN PATENT DOCUMENTS

JP 2004273185 A 9/2004
JP 2006156643 A 6/2006
(Continued)

OTHER PUBLICATIONS

Non Final Office Action for Corresponding U.S. Appl. No. 14/493,095, dated Jul. 25, 2016, 11 pages.
(Continued)

*Primary Examiner* — Jason Moon Han
(74) *Attorney, Agent, or Firm* — The Marbury Law Group PLLC

(57) ABSTRACT

A light emitting device includes a support having an interstice and at least one LED located in the interstice and at least one of a waveguide or an optical launch having a transparent material encapsulating the at least one LED located in the interstice.

24 Claims, 14 Drawing Sheets

Related U.S. Application Data filed on Oct. 23, 2013, provisional application No. 61/905,587, filed on Nov. 18, 2013, provisional application No. 62/035,872, filed on Aug. 11, 2014.

(51) Int. Cl.

| | | |
|---|---|---|
| *H01L 21/66* | (2006.01) | |
| *H01L 33/52* | (2010.01) | |
| *F21K 9/90* | (2016.01) | |
| *F21V 19/00* | (2006.01) | |
| *H01L 21/48* | (2006.01) | |
| *H01L 33/58* | (2010.01) | |

(52) U.S. Cl.
CPC .......... *G02B 6/0041* (2013.01); *G02B 6/0056* (2013.01); *H01L 33/58* (2013.01); *H01L 2224/48091* (2013.01); *H01L 2933/005* (2013.01); *H01L 2933/0033* (2013.01); *H01L 2933/0058* (2013.01); *Y10T 29/49121* (2015.01); *Y10T 29/49146* (2015.01)

(56) References Cited

U.S. PATENT DOCUMENTS

| | | | |
|---|---|---|---|
| 7,829,901 B2* | 11/2010 | Wang | F21K 9/00 257/88 |
| 8,198,800 B2* | 6/2012 | Wang | H01L 33/507 257/88 |
| 8,414,173 B2 | 4/2013 | Masuda et al. | |
| 8,651,711 B2* | 2/2014 | Rudisill | H05K 3/325 362/249.02 |
| 9,273,830 B2 | 3/2016 | Negley et al. | |
| 2004/0070990 A1* | 4/2004 | Szypszak | G01N 21/8806 362/555 |
| 2004/0169786 A1 | 9/2004 | Yamazaki et al. | |
| 2005/0111241 A1 | 5/2005 | Parker | |
| 2007/0253216 A1 | 11/2007 | Watanabe | |
| 2007/0263409 A1* | 11/2007 | Mok | G02B 6/0026 362/612 |
| 2007/0274095 A1 | 11/2007 | Destain | |
| 2009/0128781 A1 | 5/2009 | Li | |
| 2009/0135315 A1 | 5/2009 | Endo et al. | |
| 2009/0244882 A1 | 10/2009 | Samber et al. | |
| 2009/0303410 A1 | 12/2009 | Murata et al. | |
| 2009/0303728 A1 | 12/2009 | Ueji et al. | |
| 2010/0073597 A1 | 3/2010 | Bierhuizen et al. | |
| 2010/0231112 A1 | 9/2010 | Lee | |
| 2012/0243254 A1 | 9/2012 | Frost et al. | |
| 2013/0258216 A1 | 10/2013 | Shiue et al. | |
| 2014/0177260 A1 | 6/2014 | George et al. | |
| 2014/0241002 A1 | 8/2014 | Lin et al. | |

FOREIGN PATENT DOCUMENTS

| | | |
|---|---|---|
| JP | 2007043179 A | 2/2007 |
| JP | 2009252419 A | 10/2009 |
| JP | 2010021131 A | 1/2010 |
| JP | 2011-065010 A | 3/2011 |
| JP | 2013084702 A | 5/2013 |
| KR | 10-2008-0077220 A | 8/2008 |
| TW | 200714978 A | 4/2007 |
| TW | 200807767 A | 2/2008 |
| TW | 201237326 A | 9/2012 |
| WO | WO2005012787 A1 | 2/2005 |
| WO | WO 2006/131924 | 12/2006 |

OTHER PUBLICATIONS

International Preliminary Report or Patentability and Written Opinion of the International Searching Authority for International Application No. PCT/US2014/068782, dated Jun. 23, 2016, 10 pages.
International Preliminary Report or Patentability and Written Opinion of the International Searching Authority for International Application No. PCT/US2014/056811, dated Apr. 7, 2016, 16 pages.
International Search Report and Written Opinion received in connection with international application No. PCT/US2014/068782, dated Apr. 9, 2015.
International Search Report and Written Opinion received in connection with international application No. PCT/US2014/056811, dated Jan. 26, 2015.
First Office Action from the Japan Patent Office for Japanese Patent Application No. 2016-544049, dated Jul. 13, 2018, 6 pages.
Office Action and Search Report from Taiwan Intellectual Property for ROC (Taiwan) Patent Application No. 103132670, dated Jul. 26, 2018, 3 pages.
English-language Translation of First Office Action from the Japan Patent Office for Japanese Patent Application No. 2016-544049, dated Jul. 13, 2018, 6 pages.

* cited by examiner

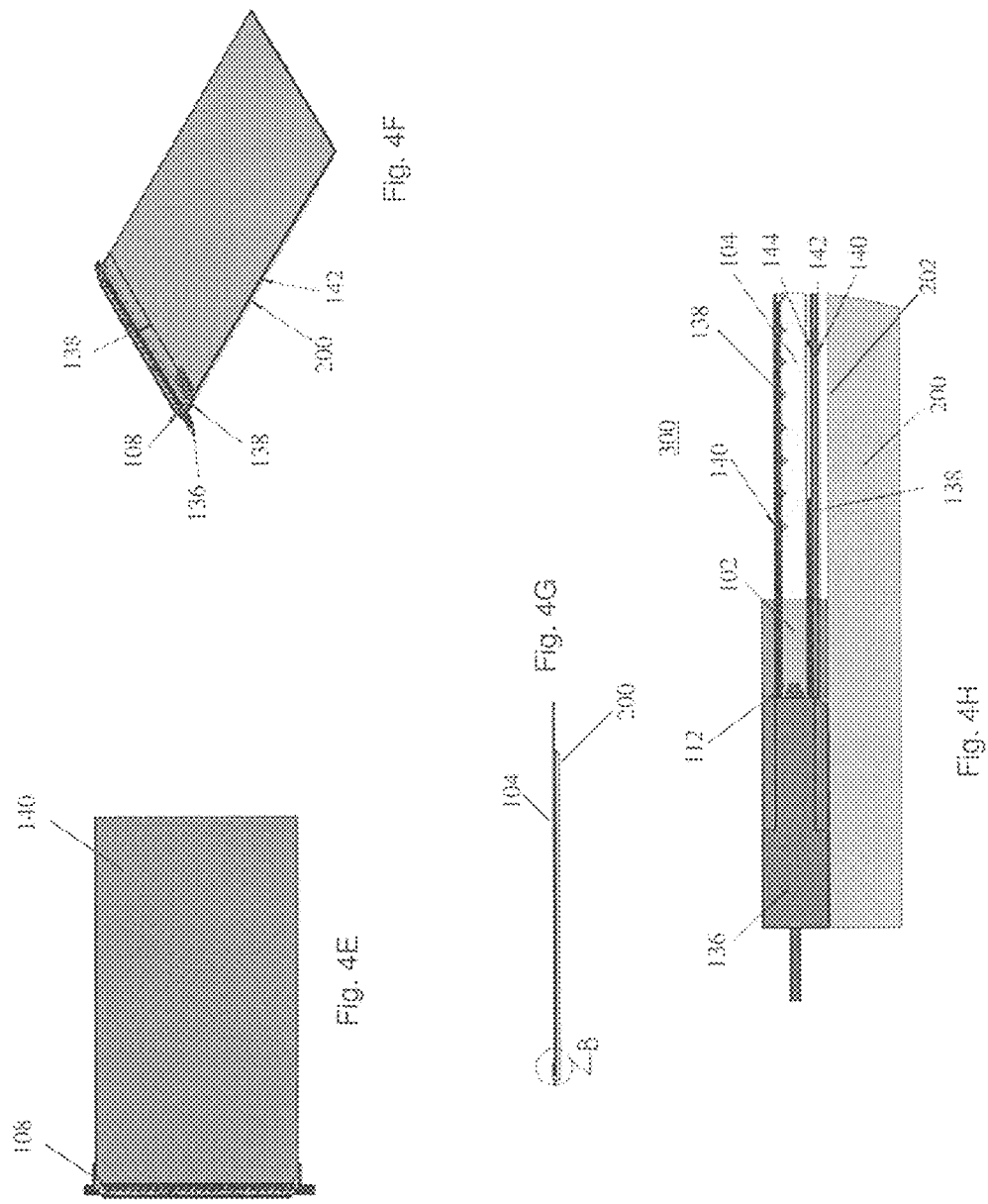

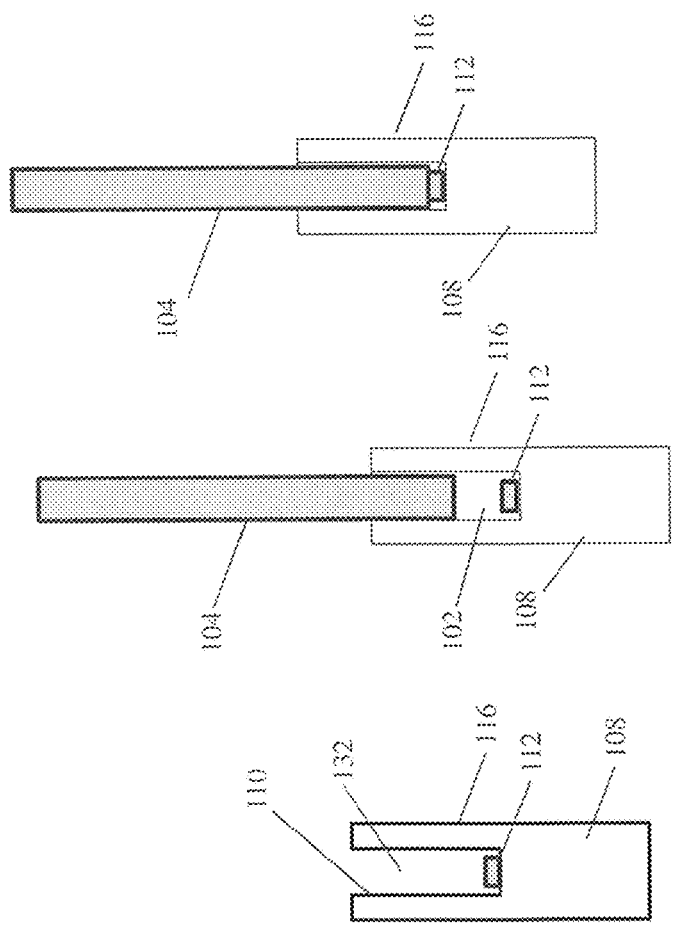

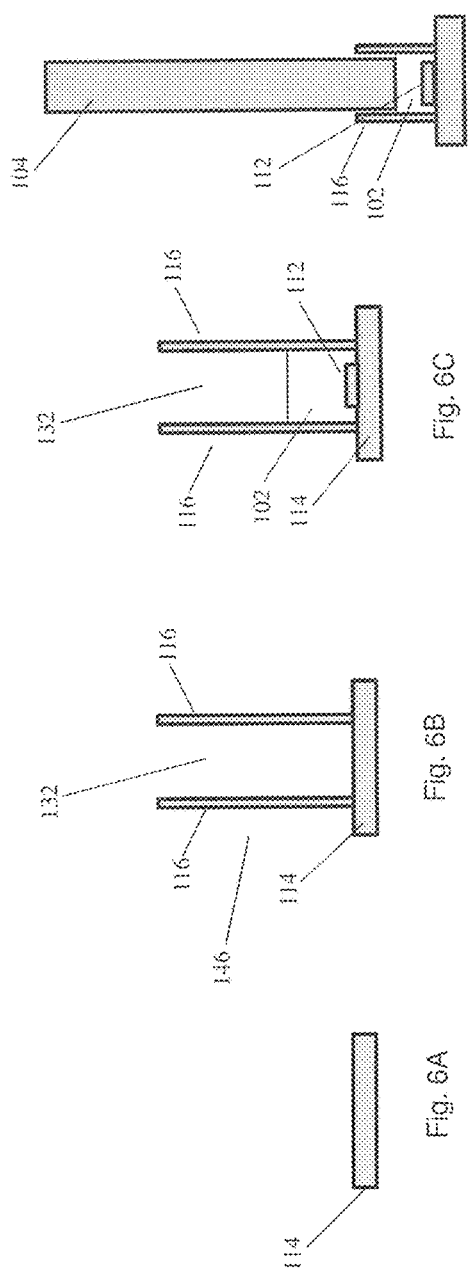

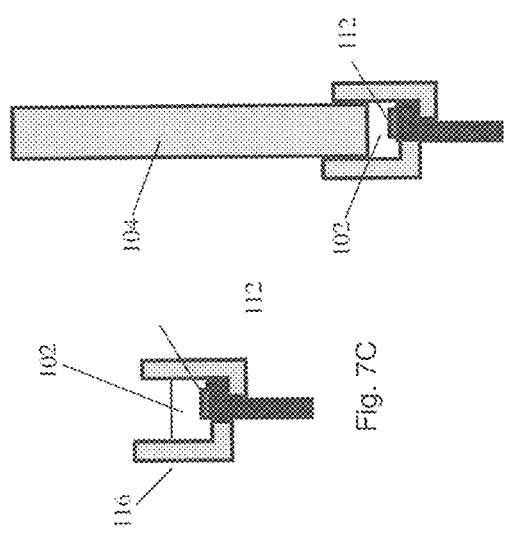
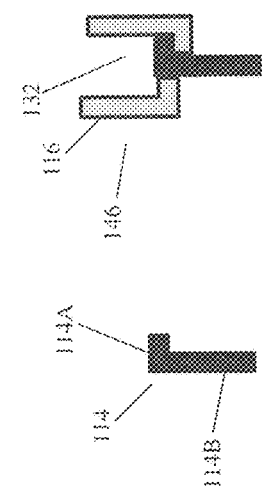
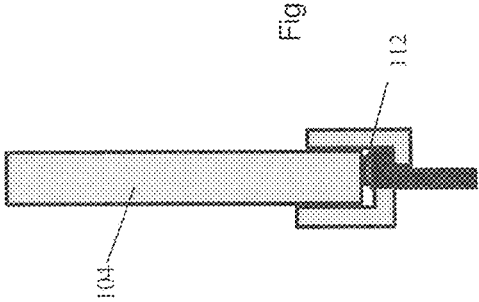
Fig. 7A  Fig. 7B  Fig. 7C  Fig. 7D  Fig. 7E

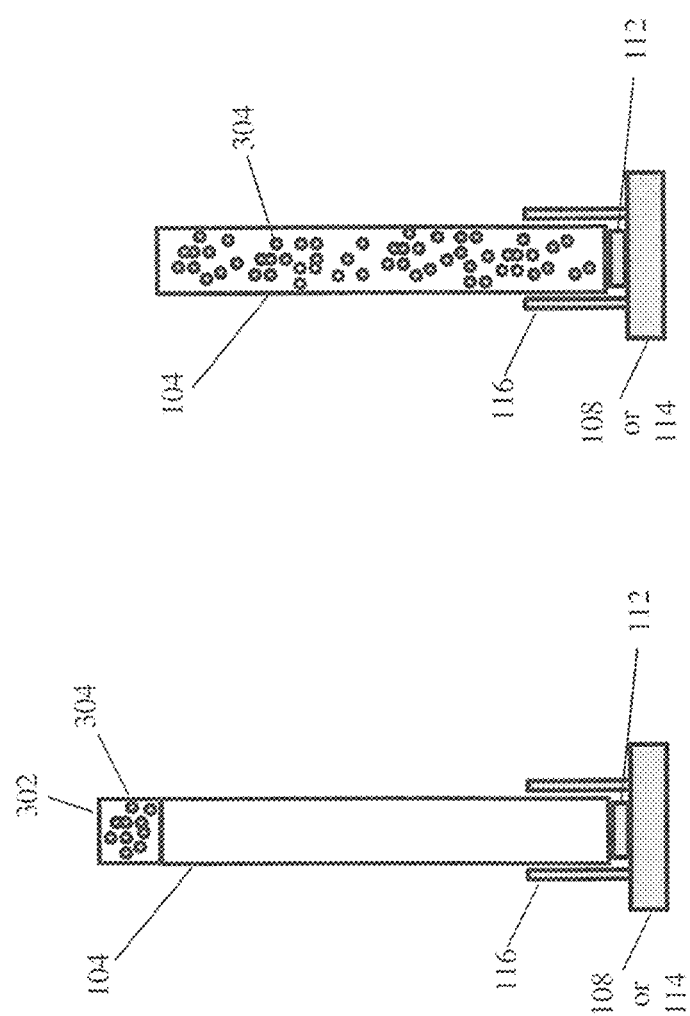

INTEGRATED BACK LIGHT UNIT

RELATED APPLICATIONS

This application is related to U.S. Provisional Patent Application Nos. 61/881,037, filed Sep. 23, 2013, 61/894,466, filed Oct. 23, 2013, 61/905,587, filed Nov. 18, 2013, and 62/035,872, filed Aug. 11, 2014, the entire contents of all of which are incorporated herein by reference.

FIELD

The embodiments of the invention are directed generally to semiconductor light emitting devices, such as light emitting diodes (LED), and specifically an integrated back light LED unit.

BACKGROUND

LEDs are used in electronic displays, such as liquid crystal displays in laptops or LED televisions. Conventional LED units are fabricated by mounting LEDs to a substrate, encapsulating the mounted LEDs and then optically coupling the encapsulated LEDs to an optical waveguide. The conventional LED units may suffer from poor optical coupling.

SUMMARY

An embodiment relates to a light emitting device including a light emitting diode (LED) assembly having a support having an interstice and at least one LED located in the interstice and at least one of a waveguide or an optical launch having a transparent material encapsulating the at least one LED located in the interstice.

Another embodiment relates to an integrated back light unit, comprising: a light emitting device assembly comprising a support having an interstice, at least one light emitting device located in the interstice, and an optical launch comprising a transparent material encapsulating the at least one light emitting device located in the interstice, and a back light waveguide optically coupled to the optical launch, such that the back light waveguide directly contacts the transparent material.

Another embodiment relates to a method of making a light emitting device including providing a light emitting diode (LED) assembly with a support having an interstice and at least one LED located in the interstice and encapsulating the at least one LED with a transparent material which forms at least one of a waveguide and an optical launch which at least partially fills the interstice.

An embodiment relates to an integrated back light unit including a light emitting device assembly comprising a support having an interstice, at least one light emitting device located in the interstice, and an optical launch comprising a transparent material encapsulating the at least one light emitting device located in the interstice, a back light waveguide optically coupled to the optical launch, and an index matching compound located between the optical launch and the back light waveguide.

Another embodiment relates to an integrated back light unit including a light emitting device assembly comprising a support having an interstice, at least one light emitting device located in the interstice, and an optical launch comprising a transparent material encapsulating the at least one light emitting device located in the interstice, a back light waveguide optically coupled to the optical launch; and a circumferential polarizer located around the back light waveguide to reduce light loss from an optical hot spot in the back light waveguide.

Another embodiment relates to an method of making a light emitting device including providing a panel comprising rows of light emitting diodes, each row of light emitting diodes located in a support having an interstice, light emitting diodes located in the interstice, and encapsulating the rows of light emitting diodes with a transparent material which forms at least one of a waveguide or an optical launch which at least partially fills the interstice, and slicing the panel to provide separate light emitting devices comprising a row of light emitting diodes.

Another embodiment relates to an integrated back light unit, comprising a light emitting device assembly comprising a support having an interstice, at least one light emitting device located in the interstice, a back light waveguide directly or indirectly optically coupled to the at least one light emitting device, and a circuit configured to provide an electrical connection to the light emitting device, wherein the circuit is integral with the support or is mounted to an outside surface of the support.

BRIEF DESCRIPTION OF THE DRAWINGS

FIG. 4E is a plan view of an integrated back light unit according to an embodiment.

FIG. 4F is a perspective view of an integrated back light unit illustrated in FIG. 4E.

FIG. 4G is a side cross sectional view of an integrated back light unit illustrated in FIG. 4E.

FIG. 4H is a side cross sectional close up of portion B of the integrated back light unit illustrated in FIG. 4G.

FIGS. 5A-5C illustrate steps in a method of fabricating an integrated back light unit according to an embodiment. FIG. 5D illustrates an alternative integrated back light unit according to an embodiment.

FIGS. 6A-6D illustrate steps in another method of fabricating an integrated back light unit according to an embodiment. FIG. 6E illustrates an alternative integrated back light unit according to an embodiment.

FIGS. 7A-7D illustrate an alternative method of fabricating an integrated back light unit according to an embodiment. FIG. 7E illustrates an alternative integrated back light unit according to an embodiment.

FIGS. 11A-11B illustrate alternative embodiments of integrated back light units.

DETAILED DESCRIPTION

The present inventors realized that prior art backlight solutions which utilize LED light sources and which are intended for uniform illumination applications, such as transmissive and reflective displays and thin profile panel luminaires suffer from degraded overall optical system efficiency due to one or more of the following limitations:
1. The inherent optical loss originating from the absorptive loss that stems from the package housing the LED emitters;
2. The etendue of the coupling optics among the LED emitters, LED package and the light guide plate;
3. The assembly tolerances in five degrees of freedom originating from the placement of the LED package, the air gap between the package and the light guide plate and the alignment of light guide plate to the LED package; and
4. The continuing desire to reduce the overall thickness of the backlighting units' thickness.

The quest for slimmer light panels and thinner display, particularly in the mobile digital appliance markets, exacerbates the aforementioned challenges.

Embodiments are drawn to a light emitting device which includes a light emitting diode (LED) assembly with a support having an interstice and at least one LED located in the interstice and a transparent material encapsulating the at least one LED and which forms at least part of an optical launch and/or a waveguide. In other words, the LED die encapsulant forms the optical launch and/or the waveguide, such as a light guiding plate. Other embodiments are drawn to an integrated back light unit which includes the optical launch and a back light waveguide optically coupled to the optical launch. Preferably, the back light waveguide directly contacts the transparent material. Other embodiments are drawn to methods of making light emitting devices and integrated back light units. Embodiments of the method of making an integrated back light unit include making a light emitting device by attaching at least one LED in an interstice located in a support and encapsulating the at least one LED with a transparent material which forms at least part of an optical launch and/or a waveguide. In one embodiment, the method of making an integrated back light unit also includes optically coupling a back light waveguide to the optical launch. Preferably, the back light waveguide directly contacts the transparent material.

This integrated back light unit architecture eliminates the first-level packaging of LED emitters and allows very efficient optical launch of emitted photons into the waveguide, such as a light guide plate without the in-package and coupling losses associated with conventional architectures of back light units for display and illumination applications. This provides the direct coupling of the light guide plate to the LED emitters by co-molding that eliminates or reduces undesirable optical interfaces.

Figure 2:
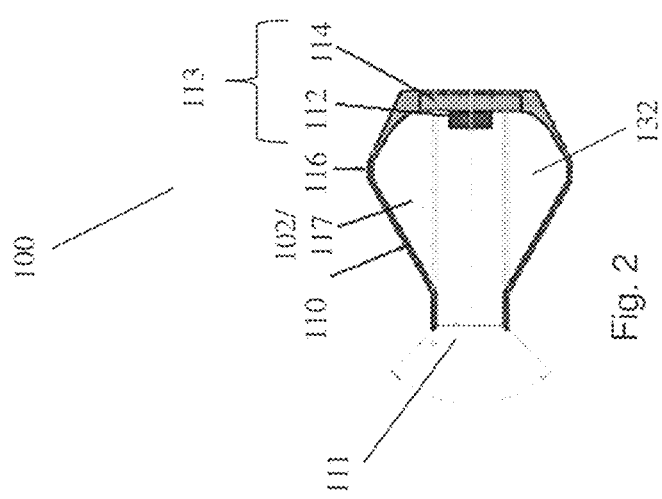
FIG. 2 is a schematic illustration of a side cross sectional view of an integrated back light unit according to another embodiment.
Figure 1:
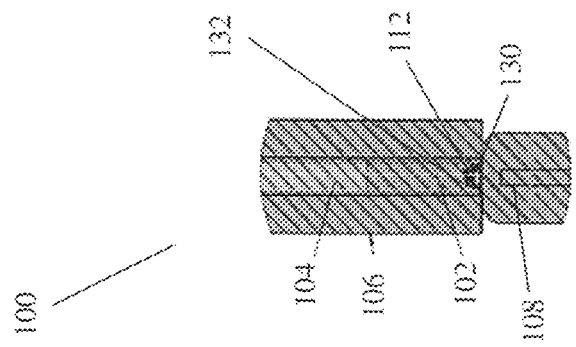
FIG. 1 is a schematic illustration of a side cross sectional view of an integrated back light unit according to an embodiment.

FIGS. 1 and 2 are schematic illustrations of a packaged LED device unit 100 in which the LED die encapsulant forms the optical launch and which can be used with a waveguide to form an integrated back light unit, according to alternative embodiments. The unit 100 includes a support, such as a molded lead frame 108 (as shown in FIG. 1) or a circuit board 114 (as shown in FIG. 2) supporting at least one LED die 112 (e.g., chip) in an interstice 132, a transparent material 117 encapsulating the at least one LED die 112 and which forms at least part of an optical launch 102, and a plurality of leads/contacts 130 (one of which is shown in FIG. 1). The interstice 132 may comprise any suitable intervening space between the bottom and side surface(s) of the package that contains the LED die 112. The interstice 132 may have a slit shape or any other shape, such as cylindrical, conical, polyhedron, pyramidal, irregular, etc. The LED die 112 may include one or more light-emitting semiconductor elements (such as red, green and blue emitting LEDs or blue emitting LEDs covered with yellow emitting phosphor) which may be mounted on an upper surface of a lead/contact 130.

Figure 3B:
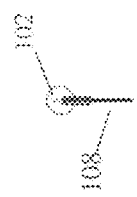
FIGS. 3A-3D illustrate a light emitting device according to an embodiment including: (A) a plan view; (B) a side cross sectional view through section J-J of FIG. 3(F); (C) a close up of the plan view of FIG. 3 (A); and (D) a close up of the cross sectional view of FIG. 3(B).
Figure 3D:
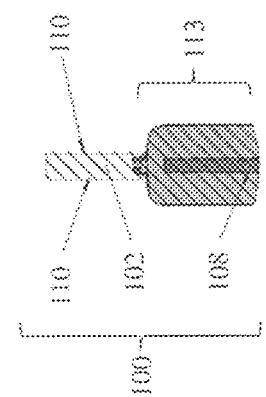
Figure 3A:
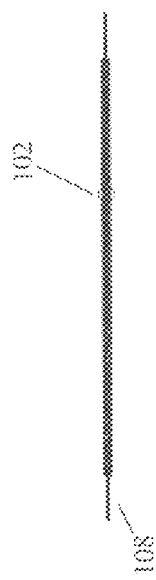
Figure 4B:
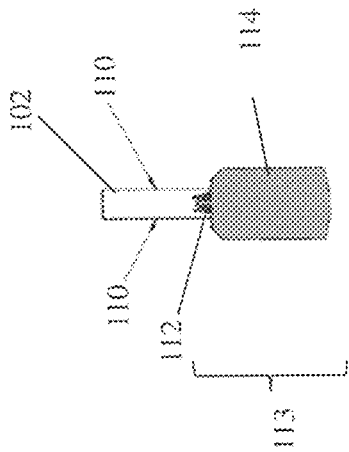
FIG. 4B is a side cross sectional view of light emitting device for an integrated back light unit according to an embodiment. The light emitting device includes an optical launch with metallized side faces.
Figure 4A:
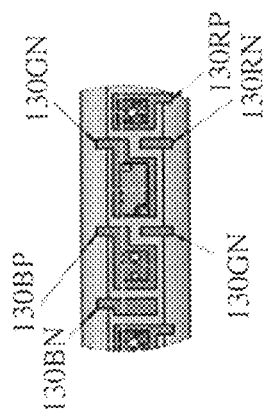
FIG. 4A is a plan view of a portion of an integrated back light unit according to an embodiment with die bonded LEDs.
Figure 4C:
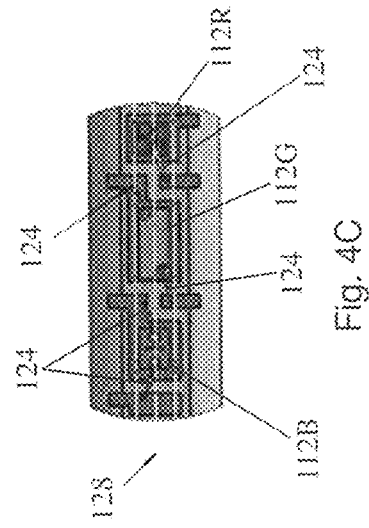
FIG. 4C is a plan view of an integrated back light unit according to an embodiment with wire bonded LEDs.

As shown in FIGS. 3D and 4B, the support, such a lead frame 108 or a printed circuit board 114 and at least one LED die 112 located in the interstice 132 in the support together form a light emitting diode (LED) assembly 113 of the packaged LED unit 100. As shown in FIGS. 4A and 4C, the lead frame 108 of the assembly 113 may comprise a molded lead frame which includes an open top, molded polymer housing 116 with embedded plural (e.g., at least first and second) electrically conductive lead frame 108 leads 130. The interstice 132 is located between sidewalls and a bottom surface of the housing 116 and the at least one LED (e.g., LED die) 112 is located in the interstice 132 and electrically connected to the first and to the second electrically conductive lead frame leads 130.

The LED die 112 may be mounted to the upper surface the lead/contact 130 using any suitable bonding or attaching technique. In embodiments, the surface of the LED die 112 may be electrically insulated from the lead/contact 130 via an insulating material (e.g., a sapphire layer), which may be or may form part of the support substrate of the die 112.

Figure 3C:
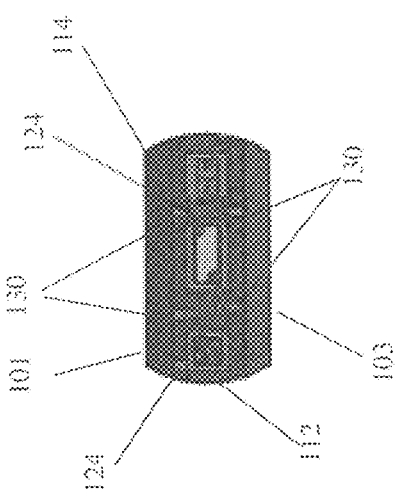

As illustrated in FIGS. 3C and 4C, the LED die 112 may be wire bonded with wire bonds 124 to the first and to the second electrically conductive contacts/leads, such as lead frame leads 130. Thus, the active region of the LED die 112 may be electrically connected to the first lead 130 by a first wire 124, which may be bonded to a first bond pad region of the die 112 as illustrated in FIG. 3C. A second wire 124 may be bonded to a second bond pad region of the die 112 to electrically connect the die 112 to the second lead 130. In an alternative embodiment, the at least one LED die 112 is bonded to the electrically conductive lead frame leads 130 as illustrated in FIG. 4A. Preferably, all electrical connections (e.g., the wire bonds 124 or direct bonds) between the LED die 112 and the contacts/leads 130, such as the first and the second electrically conductive lead frame leads 130 are located within the transparent material of the optical launch 102.

In the embodiment illustrated in FIG. 2, the packaged LED unit 100 is formed on a circuit board 114 support, such as a printed or flexible circuit board rather than on a molded lead frame. The unit 100 of FIG. 2 also includes a housing 116, which may be a protective, open top package around the die 112 and leads 130. In embodiments, the housing 116 may be a molded epoxy material, although other materials (e.g., ceramic, plastic, glass, etc.) may be utilized. The leads 130 may be at least partially embedded in the housing 116. As shown in FIG. 2, the housing 116 may form the sidewalls and optionally at least a portion of the bottom surface of the unit 100 and may include an opening 111 in its upper surface exposing at least one LED die 112. In the embodiment of FIG. 2, a printed circuit board 114 forms at least part of the bottom surface of the unit 100. In embodiments, the housing 116 forms a pocket with an interstice 132 that surrounds the LED die 112.

Preferably, the interstice 132 may be filled with an encapsulant material 117 that is optically transparent (e.g. at least 80%, such as 80-95% transmissive) over at least a selected wavelength range, such as 400-700 nm. The transparent material 117 may be silicone, acrylic polymer (e.g., poly (methyl methacrylate) ("PMMA") or epoxy or any other suitable transparent material, and forms at least a portion of the optical launch 102. Optionally, the encapsulant may include a phosphor or dye material mixed in with the silicone, polymer or epoxy. In an embodiment, the housing 116 includes a single LED die 112. In other embodiments, multiple LED die 112 may be included within a housing 116, either in the same or in different interstice 132 of the housing 116, as discussed in more detail below.

Figure 4D:
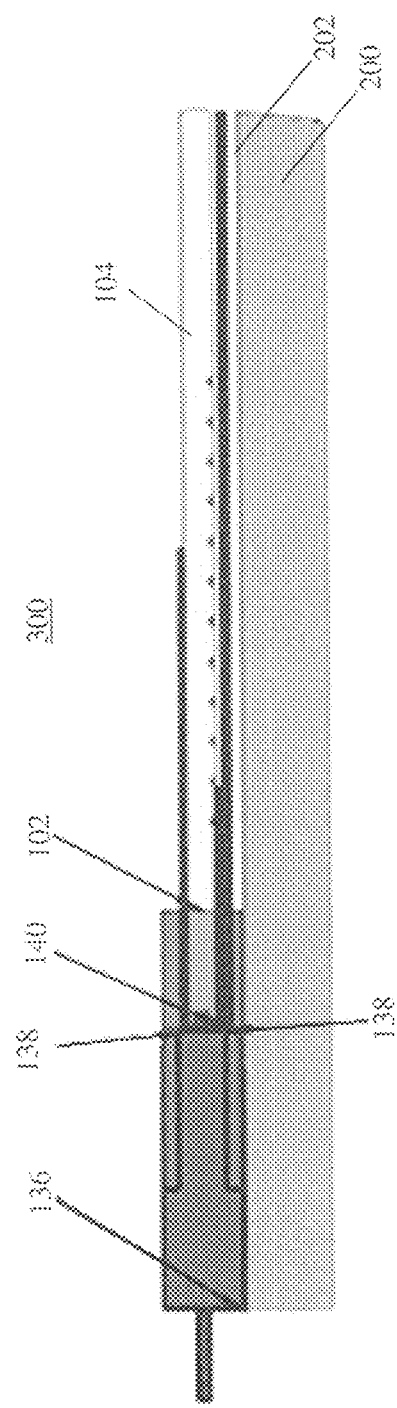
FIG. 4D is a side cross sectional view of an integrated back light unit according to an embodiment.

In an embodiment illustrated in FIGS. 1, 3D, 4B, 4D and 4H, the transparent material overfills the interstice 132 and extends from the interstice 132 above an upper surface of the support 108/114 (i.e., above the upper surface of the housing/package 116 or assembly LED 113). In this embodiment, a bottom portion of a waveguide 104 contacts the transparent material of the launch 102 above the interstice 132. The waveguide 104 is attached to the optical launch 102 by at least one of a clamp and a tape (136 and/or 138) above the interstice 132 to form the integrated back light unit 300, as shown in FIGS. 4D and 4H. Preferably a reflective material 110, such as a silver or aluminum layer or another reflective material is located over at least a portion of side surfaces of the transparent material of the optical launch 102 which extends above the upper surface of the LED assembly 113, as shown in FIGS. 3D and 4B.

In another embodiment shown in FIG. 5C, the transparent material 117 of the optical launch 102 only partially fills the interstice 132. In this embodiment, a bottom portion of the waveguide 104, such as a light guide panel, extends into the interstice 132 to contact the transparent material of the launch 102 in the interstice 132, as shown in FIG. 5C. The light guide panel 104 is attached to the optical launch 102 by sidewalls of the support structure (e.g., the housing/package 116) surrounding the interstice 132. In one non-limiting configuration of this embodiment that will be described in more detail below, the package 116 may comprise a molded or stamped pocket 146 located on a circuit board 114.

In another embodiment shown in FIG. 5D, the optical launch 102 is omitted and the transparent material molding material forms a waveguide 104, such as a light guiding plate. The molding material in the form of the light guiding plate 104 completely fills the interstice 132 and extends out of the interstice 132 over the upper surface of the support, such as a molded lead frame.

In one embodiment, the LED die 112 may be a white light emitting LED (e.g. a blue LED 112B covered with a yellow emitting phosphor which together appear to emit white light to an observer) or plural closely spaced LED die (e.g. plural red, green, blue emitting LED die 112R, 112G, 112B), as shown in FIG. 3C.

Any suitable LED structure may be utilized. In embodiments, the LED may be a nanowire-based LED. Nanowire LEDs are typically based on one or more pn- or pin-junctions. Each nanowire may comprise a first conductivity type (e.g., doped n-type) nanowire core and an enclosing second conductivity type (e.g., doped p-type) shell for forming a pn or pin junction that in operation provides an active region for light generation. An intermediate active region between the core and shell may comprise a single intrinsic or lightly doped (e.g., doping level below $10^{16}$ cm$^{-3}$) semiconductor layer or one or more quantum wells, such as 3-10 quantum wells comprising a plurality of semiconductor layers of different band gaps. Nanowires are typically arranged in arrays comprising hundreds, thousands, tens of thousands, or more, of nanowires side by side on the supporting substrate to form the LED structure. The nanowires may comprise a variety of semiconductor materials, such as III-V semiconductors and/or III-nitride semiconductors, and suitable materials include, without limitation GaAs, InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, AlN, GaP and Si. The supporting substrate may include, without limitation, III-V or II-VI semiconductors, Si, Ge, $Al_2O_3$, SiC, Quartz and glass. Further details regarding nanowire LEDs and methods of fabrication are discussed, for example, in U.S. Pat. Nos. 7,396,696, 7,335,908 and 7,829,443, PCT Publication Nos. WO2010014032, WO2008048704 and WO2007102781, and in Swedish patent application SE 1050700-2, all of which are incorporated by reference in their entirety herein.

Alternatively, bulk (i.e., planar layer type) LEDs may be used instead of or in addition to the nanowire LEDs. Furthermore, while inorganic semiconductor nanowire or bulk light emitting diodes are preferred, any other light emitting devices may be used instead, such as laser, organic light emitting diode (OLED) (including small molecule, polymer and/or phosphorescent based OLED), light emitting electrochemical cell (LEC), chemoluminescent, fluorescent, cathodoluminescent, electron stimulated luminescent (ESL), resistive filament incandescent, halogen incandescent, and/or gas discharge light emitting device. The light emitting device may emit any suitable radiation wavelength (e.g., peak or band), such as visible radiation (i.e., visible light having any one or more peak or band wavelengths in a range of 400 to 700 nm).

In one embodiment illustrated in more detail in FIG. 4A, the unit 100 includes a red LED n contact 130RN, a red LED p contact 130RP, a green LED n contact 130GN, a LED green p contact 130GP, a blue LED n contact 130BN and blue LED p contact 130BP. Each lead/contact 130 may be formed of an electrically conductive material (e.g., a metal, such as copper, which may be optionally coated with nickel and/or silver). The leads/contacts 130 may be formed as part of a lead frame, packaged and separated from the frame to produce individual units 100. The leads/contacts 130 may extend generally parallel without contacting one another between a first side surface 101 and a second side surface 103 of the unit 100.

The unit 100 is not limited to three LED die 112. Embodiment units 100 include a housing/package 116 that may include dozens or hundreds or more LED die 112R, 112G, 112B. The packaged LED unit 100 may include a plurality of leads/contacts 130RN, 130RP, 130GN, 130GP, 130BN, 130BP to electrically connect the LED die 112R, 112G, 112B, as illustrated in FIG. 4A. Each of the die 112R, 112G, 112B may be mounted on a top surface of a lead and electrically connected to at least two different leads, as described above.

The unit 100 together with the waveguide 104 may be mounted to a support surface 200, such as a base plate 200, in either a top-emitting configuration (e.g., with the light emitted perpendicular to the major surface 202 of the plate 200 supporting the unit 100) or in a side-emitting configuration (e.g., with the light emitted parallel to the major surface 202 of the plate 200 supporting the unit 100), as illustrated in FIGS. 4D and 4G. For example, the integrated back light unit 300 may be located over a base plate 200 in a side emitting configuration such that a side of the packaged LED device unit 100 support, e.g., molded lead frame 108/116, is located on a major surface of the base plate 200, and the exposed contacts 130 on the side of the package 116 of the molded lead frame 108 contact the respective electrodes on the base plate 200. In this embodiment, at least one of a diffuser 144, filter 142 and polarizer 140 film(s) are located over first and second surfaces of the waveguide 104 as illustrated in FIGS. 4D, 4E, 4F and 4H.

Embodiments also include methods of making a light emitting device. An embodiment includes providing a light emitting diode (LED) assembly 113 which includes a support, such as molded lead frame 108 or a circuit board 114, having an interstice 132 and at least one LED die 112 located in the interstice 132. The method also includes encapsulating the at least one LED die 112 with a transparent material 117 which forms an optical launch 102 which at least partially fills the interstice 132.

In one embodiment illustrated in FIGS. 3A-D, 4A-H and 5A-5C, the support comprises the molded lead frame 108. The molded lead frame 108 is formed by molding a polymer housing 116 around a lead frame to embed first and second electrically conductive lead frame leads 130 in the housing 116. The molded lead frame 108 includes a housing 116 (e.g., molded package portion) with the interstice (e.g., alignment channel or cavity) 132 located between sidewalls and a bottom surface of the housing 116, as shown in FIGS. 5A and 5B.

If needed, an electrode material is formed in the interstice 132, such as by coating the leads 130 with a Ni and/or Ag layer. The reflective 110 material is then formed on sidewalls of the support (e.g., housing 116) surrounding the interstice 132 prior to encapsulating the LED die 112, as shown in FIG. 5B. The die bond pads are then formed by laser ablation or chemical etching of the exposed leads 130, if the leads do not have the required bond pad shape.

The at least one LED die 112 is placed in the interstice 132, as shown in FIG. 5B, and electrically connected to the first and to the second electrically conductive lead frame leads 130. In an embodiment, the at least one LED die 112 is wire bonded to the first and to the second electrically conductive lead frame leads 130, as shown in FIG. 4C. In an alternative embodiment, the LED die 112 is mounted to the lead frame 108 without the use of a housing 116. This embodiment lacks an interstice. In an embodiment, a housing 116 made of the same or a different material as the lead frame 108 may be affixed to the lead frame 108 after mounting the LED die(s) 112.

Additionally, the step of encapsulating the at least one LED die 112 with the transparent material 117 includes encapsulating the wire bonds 124 between the at least one LED die 112 and the first and the second electrically conductive lead frame leads 130, such that the wire bonds are located within the transparent material of the optical launch 102, as shown in FIG. 5C.

The method further includes optically coupling a back light waveguide 104 to the optical launch 102, such that the back light waveguide 104 directly contacts the transparent material. In an embodiment, the back light waveguide 104 is a light guide panel and the transparent material of the launch 102 only partially fills the interstice 132 (e.g., 25-75% fill, such as about 50% fill), as shown in FIG. 5C. In this embodiment, the step of optically coupling the back light waveguide 104 includes inserting a bottom portion of the light guide panel 104 into the interstice 132 to contact the transparent material of the launch 102 in the interstice 132, such that the light guide panel 104 is attached to the optical launch 102 by sidewalls of the support structure (e.g., molded housing 116) surrounding the interstice 132, as shown in FIG. 5C.

In another embodiment shown in FIG. 5D, the optical launch 102 is omitted and the transparent material molding material forms a waveguide 104, such as a light guiding plate. The molding material is solidified in the form of the light guiding plate 104 which completely fills the interstice 132 and extends out of the interstice 132 over the upper surface of the support, such as a molded lead frame 108. Thus, the waveguide 104 is made of a moldable polymer material, directly contacts the upper surface of the LED die 112, and acts as the encapsulant for the LED die 112.

In a method of alternative embodiments illustrated in FIGS. 6A-6D and 7A-7D, the support is a circuit board 114. A pocket 146 containing the interstice 132 is located on the circuit board 114. The pocket 146 may be a molded structure, such as a housing 116, located on a surface of the circuit board 114. Thus, the bottom 114 of the interstice 132 is made of a different material and/or is made in a different step from the sidewalls (e.g., lip) 116 of the interstice 132. In this embodiment, the interstice 132 is located between sidewalls of the molded structure 116 and the bottom surface of the interstice may be the upper surface of the board 114. The LED die 112 is placed in the interstice 132 and wire bonded to contact pads 130 on the surface of the circuit board 114. Preferably, the step of encapsulating the at least one LED die 112 with the transparent material of the optical launch 102 comprises encapsulating the wire bonds 124 such that the wire bonds 124 are located within the transparent material 117 of the optical launch 102.

As illustrated in FIGS. 6A-6D, the molded structure 116 having an interstice 132 may be molded (i.e., formed) directly on the circuit board 114. In this method, a circuit board 114, such as a printed circuit board or a flexible circuit board with die bond pads and other electrodes is provided, as shown in FIG. 6A.

Then, an epoxy or another suitable molding material is provided to the surface of the board 114 and molded to form the pocket 146 (e.g., the molded housing structure 116). Preferably, a reflective white epoxy or silicone die bond dam material, such as a methyl rubber RTV silicone material sold under the names KER-2020-DAM or KER-2000-DAM by Shin-Etsu, is used to form the structure 116, as shown in FIG. 6B.

In an alternative embodiment, the pocket 146 comprises a molded structure 116 which is attached to the surface of the circuit board 114 after being molded separately from the circuit board 114, rather than being molded on the surface of the circuit board 114. This molded structure 116 may comprise a molded lead frame (e.g., a metal patterns of contacts on an insulator, such as a polymer or ceramic, that forms interconnects as base and connections for LED die) or an insulating pocket. Alternatively, the pocket 146 may comprise a stamped housing structure 116, such as a reflecting, waveguiding pocket, which is stamped on the circuit board 114. For example, the stamped pocket 146 may comprise an acrylic glass (e.g., PMMA) pocket coated with a reflective layer 110, such as an aluminum layer. The molded or stamped structure 116 may be attached to the circuit board 114 using any suitable adhesive, such as UV curable epoxy.

After forming the molded or stamped structure 116, one or more LED die 112 may located (e.g., attached) in the interstice 132 and connected (e.g., wire bonded) to the bond pads on the circuit board 114, as shown in FIG. 6C. If the structure 116 is a molded lead frame, then the LED die may be bonded inside the lead frame.

Next, the optical launch 102 may be formed in the interstice 132 by encapsulating the LED die 112 in epoxy, acrylic polymer or silicone. After forming the optical launch 102, the waveguide (e.g., light guide panel) 104 may be located in the remaining, unfilled upper part of the interstice 132 in the structure 116, as shown in FIG. 6D. The step of optically coupling the back light waveguide 104 to the optical launch may comprise inserting a bottom portion of the waveguide (e.g., light guide panel) 104 into the interstice 132 to contact the transparent material of the launch 102 in the interstice, such that the light guide panel is attached to the optical launch by sidewalls of the support (e.g., structure or housing) 116 surrounding the interstice 132.

In an alternative method, one or more LED die 112 are first located on the surface of the circuit board 114 and then the structure 116 is formed around the LED die 112 (e.g., molded, stamped or attached around the LED die).

In an alternative embodiment shown in FIG. 6E, the optical launch 102 is omitted and the transparent material molding material forms a waveguide 104, such as a light guiding plate. The molding material in the form of the light guiding plate 104 completely fills the interstice 132 and extends out of the interstice 132 over the upper surface of the structure 116.

In another embodiment illustrated in FIGS. 7A-7D, the circuit board 114 comprises a bent flexible circuit board 114 having a first portion 114a and a second portion 114b extending in a non-parallel direction with respect to the first portion 114a. For example, the second portion 114b may extend 20-160 degrees, such as 80-100 degrees, e.g., perpendicular with respect to the first portion 114a, as shown in FIG. 7A.

The pocket 146 includes a structure 116 which is molded, attached or stamped around the bent flexible circuit board 114. The structure 116 may comprise the white reflective epoxy or the reflecting, waveguiding, acrylic glass pocket described above. The first portion 114a is exposed in the interstice 132 on a bottom surface of the pocket 146, and the second portion 114b extends through the bottom surface of the pocket 146 in the non-parallel direction with respect to the first portion 114a, as shown in FIG. 7B.

The method then proceeds similar to the steps shown in FIGS. 6C-6D, where the at least one LED die 112 is attached to the first portion 114a of the bent flexible circuit board in the interstice 132 in the pocket 146, as shown in FIG. 7C. The LED die 112 is then encapsulated with the transparent material of the optical launch 102 and the waveguide (e.g., light guide panel) 104 may be located in the remaining interstice 132 in the structure 116, as shown in FIG. 7D.

In an alternative embodiment shown in FIG. 7E, the optical launch 102 is omitted and the transparent material molding material forms a waveguide 104, such as a light guiding plate. The molding material in the form of the light guiding plate 104 completely fills the interstice 132 and extends out of the interstice 132 over the upper surface of the structure 116.

In another alternative embodiment, the transparent material 117 of the optical launch 102 and/or the light guiding plate is formed to encapsulate the LED die 112 such that overfills the interstice 132 and extends from the interstice 132 above an upper surface of the support 108/116 which forms the sidewall(s) of the interstice 132. In this method, the step of optically coupling the back light waveguide 104 includes contacting a bottom portion of the waveguide 104 to the transparent material of the optical launch 102 above the interstice 132 and attaching the waveguide 104 to the optical launch 102 by at least one of a clamp and a tape (136 and/or 138) above the interstice 132, as shown in FIG. 4H, for example. Alternatively, the waveguide (e.g., an active light guiding plate) 104 may be attached to the optical launch 102 by an optically transparent molding material (e.g., polymer or epoxy) 106 which is formed by injection molding or casting around the interface of the waveguide 104 and the optical launch 102. The optically transparent molding material 106 preferably has the same or similar (e.g., differs by less than 10%) index of refraction as the index of refraction of the waveguide 104. In one embodiment, the method further includes a step of forming a reflective material 110 over side portions of the transparent material of the optical launch 102 extending above the upper surface of the support, as shown in FIGS. 3D and 4B, for example.

In another embodiment, the method further includes forming at least one of a diffuser 144, filter 142 and polarizer 140 film(s) over first and second surfaces of the waveguide 104, as shown in FIG. 4H. The method further includes mounting the unit 100 connected to the waveguide 104 over a base plate 200 in a side emitting configuration such that a side of the support 108/116 is located on a major surface 202 of the base plate 200, as shown in FIG. 4H. The waveguide 104 may be attached to the unit 100 before or after attaching the unit 100 to the base plate 200.

Figure 8:
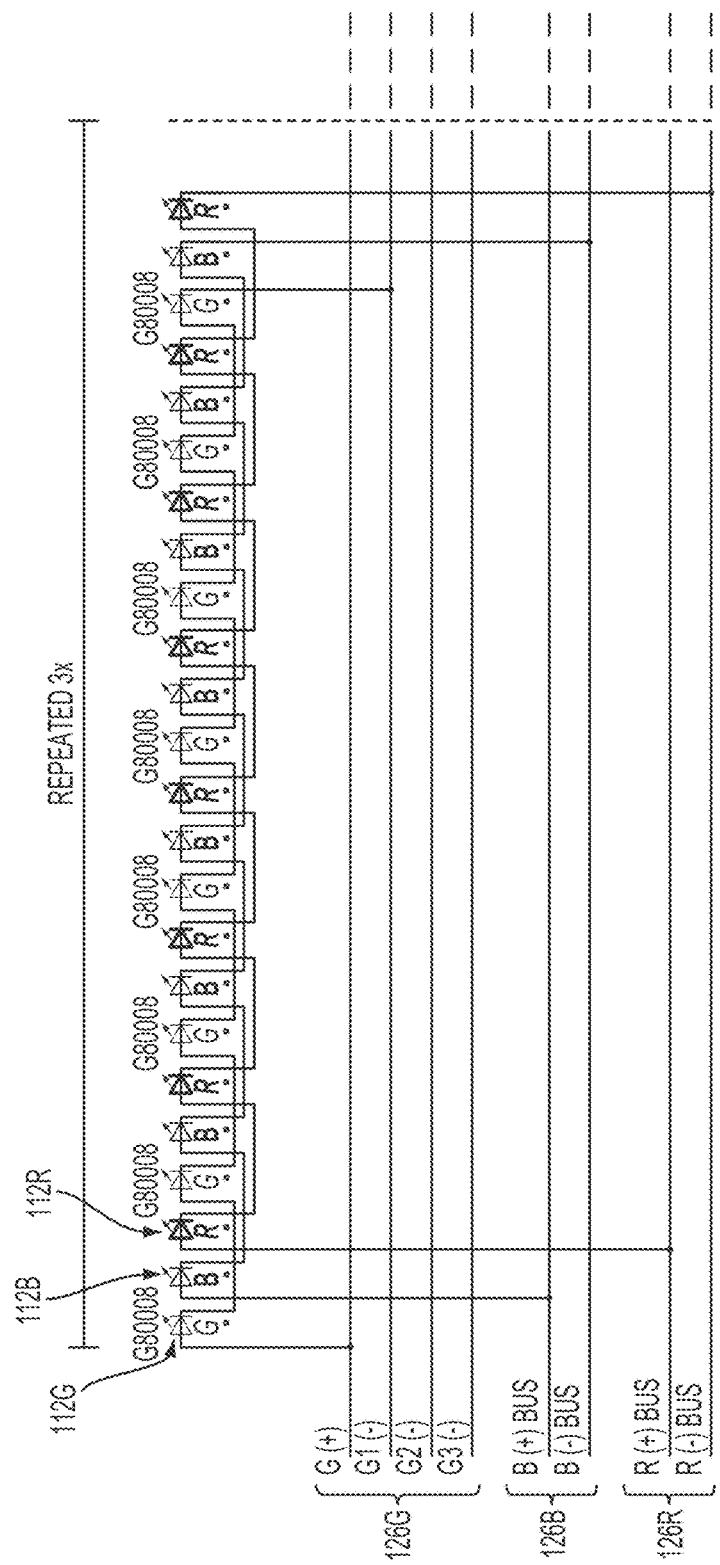
FIG. 8 is a circuit diagram illustrating a circuit configuration allowing individual control of LEDs in an array of LEDs.

FIG. 8 illustrates a circuit diagram illustrating a circuit configuration that allows individual control of LED die 112G, 112R, 112B in an array of LED die 112. When using LEDs of different color, such as red, green and blue, separate buses 126G, 126B, 126R are provided for each color LED die. Two buses 126, a positive bus and a negative bus, are typically provided for each color emitting LED die. LED die 112 which emit the same color light may be wired in series such that a first lead of the first LED die 112 in the array of series connected LED die 112 is electrically connected to one bus, such as the positive or the negative bus, and a second lead of the last LED die 112 in the array electrically connected to the other bus of the two buses.

Figure 10:
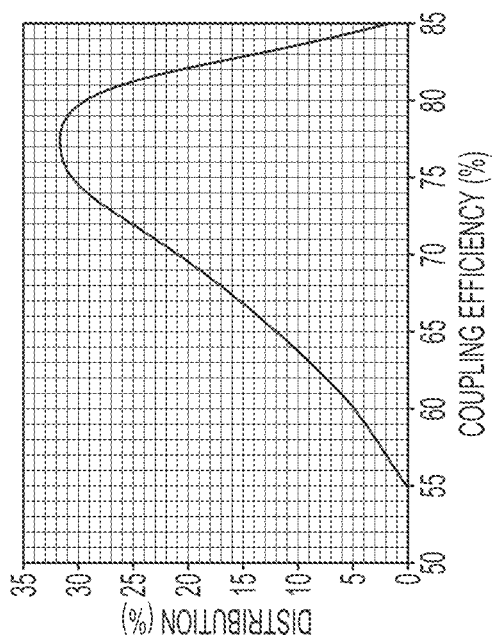
FIG. 10 is a plot of LED distribution as a function of coupling efficiency.
Figure 9:
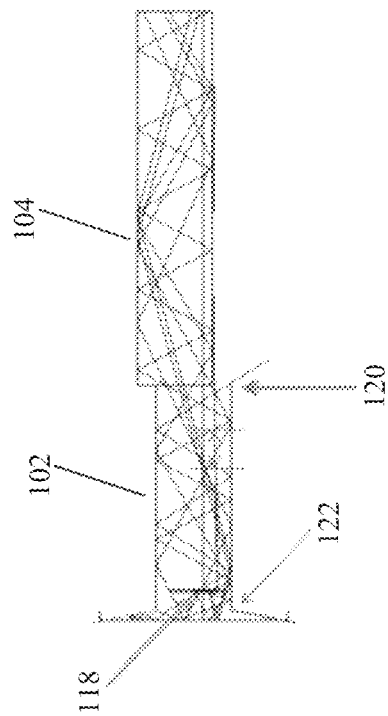
FIG. 9 is a ray diagram illustrating the effect of misalignment in an integrated back light unit according to an embodiment.

FIG. 9 is a ray diagram illustrating the effect of misalignment of the optical launch 102 of an integrated back light unit 100 and the back light waveguide 104. Lead line 118 illustrates a Y-axis misalignment. Lead line 120 illustrates a Y position misalignment. Lead line 122 illustrates the molding foot height. Five thousand simulations were run and a Monte Carlo analysis performed on the simulations. The results of the Monte Carlo analysis are illustrated in FIG. 10 which is a plot of distribution as a function of coupling efficiency, showing an acceptable device performance even with the misalignment.

It should be noted that the LED may be attached to the support using any suitable method in the embodiments described and illustrated above. For example, the LED may be attached using die attachment, flip chip attachment (e.g., flip chip bonding) or grafting methods. The LED may be attached to the support in a coplanar configuration (e.g., the major surface of the LED chip is located on and extends parallel to the major surface of the support on which the LED is located) or an edge mount configuration (e.g., the minor edge surface of the LED chip is located on and extends parallel to the major surface of the support on which the LED is located). The support may comprise any suitable material, such as polymer or epoxy housing or circuit board, metal leads encapsulated in the polymer or epoxy housing (e.g., molded lead frame), a metal support, a semiconductor (e.g., III-nitride or Group IV, such as silicon) support, etc. The electrical contact may be made to the LED using any suitable contacting method, such as wire bonding, flip chip bonding, and surface mount diode contacts (e.g., contacting a bottom surface of the diode).

While the optical launch is described and illustrated as being attached to one edge of the light guiding plate, alternative configurations may also be used, such as attaching the optical launch to a major surface (e.g., face) of the light guiding plate. Alternatively, plural optical launches may be directly attached to plural (e.g., 2, 3 or 4) edges and/or faces of the light guiding plate. Furthermore, a single launch (e.g., an L-shaped, U-shaped or rectangular shaped) launch may be directly attached to plural edges and/or faces of the light guiding plate. The device (e.g., back light unit) may be used in any suitable system, such as a system used for illumination (e.g., a lighting device or lamp) or display (e.g., liquid crystal display).

In summary, molding an optically transparent material, such as silicone or acrylic (poly(methyl methacrylate)) with a reflector on the side surfaces over a straight row of RGB LED die forms an optical launch that mates directly to the backlight waveguide. This configuration results in one or more of the following non-limiting advantages, such as improved optical coupling, reduced power consumption, shorter mixing length, smaller overall package size, and reduced cost because there is no need for individual packages. Specifically, molding the RGB LED die directly into the optical launch improves optical coupling, such as by directly butt coupling the optical launch to the waveguide. This allows a row of RGB LED die to be aligned along the edge of a waveguide and to launch light directly down the core of the waveguide through the optical launch. The optical launch shape improves coupling and shortens the mixing length, and allows metallizing the sides of the optical launch with a reflective metal layer to form the optical launch. The optical launch may be easily connected to the waveguide using any suitable method, such as clamping, taping, molding or inserting a panel shaped waveguide into an interstice partially filled with the optical launch material. The device is scalable in width, length and thickness.

This configuration further results in one or more of the following additional non-limiting advantages:

1. LED-emitted photons "see" an uninterrupted optical path into the light guide;
2. There is no discontinuity in the index of the photons flight path, thereby eliminating or reducing Fresnel loss;
3. Photons that are launched at incident angles larger than the light guide's (e.g., launch and/or waveguide) total internal reflection are guided back by reflective surfaces;
4. The optical loss due to the LED package is reduced or eliminated;
5. The total internal reflection angle of LED emitter "seeing" the light guide plate is increased to 42 degrees instead of the 26 degree angle for LED emitter to air. This enables a much larger fraction of the emitting photons to be launched into the light guide plate.
6. The co-molding of the light guide plate with the LED assembly eliminates one level of critical alignment. This results in improved coupling efficiency as well as narrow manufacturing distribution.
7. The co-molded light guide plate, owing to the elimination of the first-level LED package, allows much thinner back light unit thickness.

Alternative embodiments of the invention also provide the following optional, non-limiting advantages. The selected LED emitters may be randomly distributed within the back light unit. The wavelengths of the LED emitters are not limited to red, green and blue. A much denser placement of LED emitters within the back light unit becomes possible. Owing to the compact and area efficient architecture, it is possible to construct a large back light unit panel that is composed of multiple, smaller-sized back light unit that are arranged in grid geometry. The co-molded optical launch and light guide are readily realized on any suitable electrical substrate, organic or inorganic.

FIGS. 11A-11B illustrate alternative embodiments of integrated back light units 100. In the embodiment illustrated in FIG. 11A, a dye/phosphor layer 302 with embedded particles of an organic wavelength converting material or an inorganic wavelength converting material 304, such as dye and/or phosphor particles, is located at the distal end of the back light waveguide 104. In an aspect, the dye and/or phosphor particles 304 down convert the light from the LED 112. That is, the dye and/or phosphor particles 304 absorb light emitted at a first wavelength from the LED 112 and re-emit the light at a second, longer wavelength. For example, if the LED 112 emits blue light, dye and/or phosphor particles 304 may be selected such that the dye/phosphor layer 302 emits yellow, green or red light. In another aspect, multiple different types of dye and/or phosphor particles 304 may be embedded in the dye/phosphor layer 302 such that more than one different color light is emitted from the dye and/or phosphor particles 304. In an aspect, the different colors of light may combine in the dye/phosphor layer 302 such as to form white light. For example, for blue light emitting LEDs, particles 304 may comprise YAG:Ce nanoparticles which emit yellow light. For material and wavelength combinations may be used. Preferably, the dye and/or phosphor particles 304 are nanoscale particles, such as quantum dots.

In the embodiment illustrated in FIG. 11B, the dye and/or phosphor particles 304 are embedded directly in the back light waveguide 104. In an embodiment, the back light waveguide 104 is made of an optically transparent polymer material. Preferably, as in the previous embodiment, the dye and/or phosphor particles 304 are nanoscale particles, such as quantum dots. In another embodiment, the dye and/or phosphor particles 304 may be embedded in the optical launch, between the optical launch and the waveguide and/or in both the optical launch and the waveguide.

Figure 12:
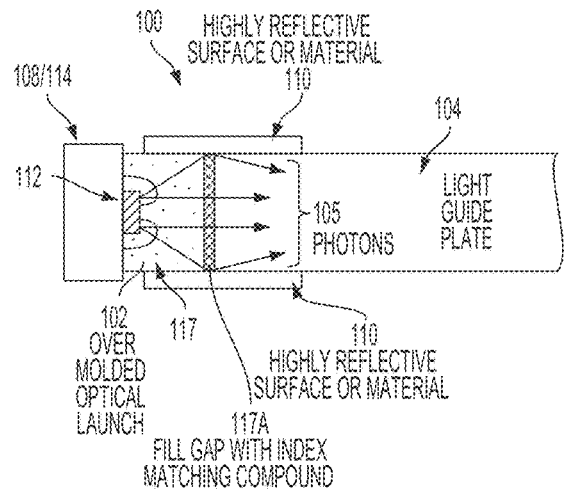
FIG. 12 is a schematic illustration of a side cross sectional view of an integrated back light unit according to an embodiment.

FIG. 12 is a schematic illustration of a side cross sectional view of an integrated back light unit 100 according to another embodiment. In this embodiment, the integrated back light unit 100 includes an optical launch 102 and a waveguide 104. This embodiment also includes an index matching compound 117A in the gap between the optical launch 102 and the waveguide 104 to improve the efficiency of the passage of photons 105 from the optical launch 102 into the waveguide 104. Optionally, a reflective material 110 as discussed above may be provided extending across the gap between the optical launch 102 and the waveguide 104. The reflective material acts as a mechanical joint between the launch and the waveguide and confines photons which would have escaped otherwise to the waveguide. Preferably, the mechanical joint comprises a metal strip of reflective material (e.g., Al, Ag, etc.) which is wrapped around an interface between the optical launch and the waveguide.

Figure 13A:
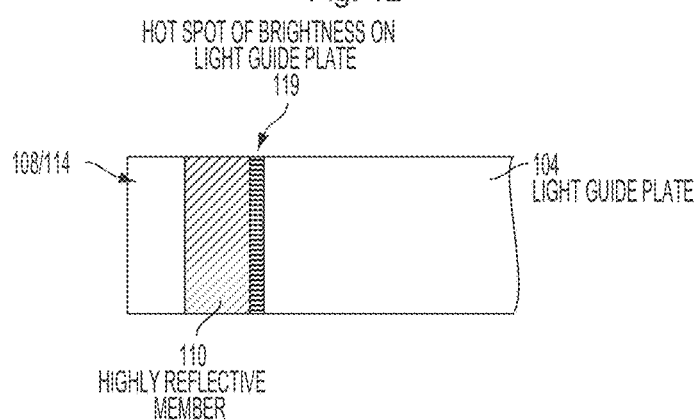
FIG. 13A is a schematic illustration of a side cross sectional view of an integrated back light unit illustrating the location of a hot spot in brightness.
Figure 13B:
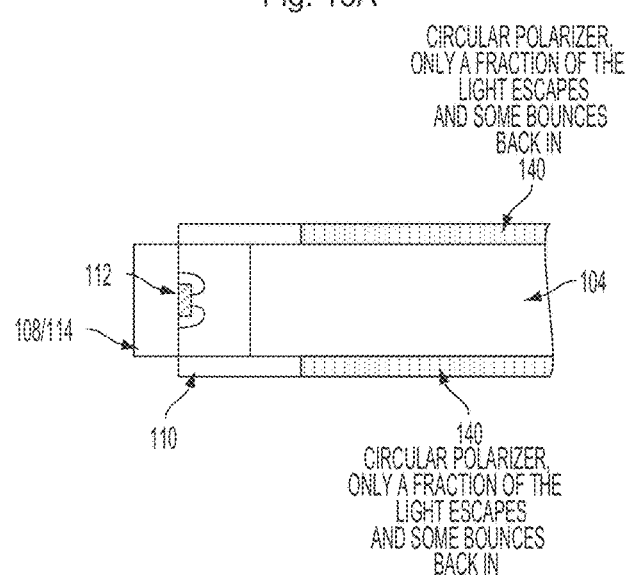
FIG. 13B is a schematic illustration of a side cross sectional view of an integrated back light unit according to another embodiment.

FIG. 13A is a schematic illustration of a side cross sectional view of an integrated back light unit 100 illustrating the location of a hot spot 119 in brightness in the waveguide 104. The inventors have discovered that the light provided from the optical launch 102 to the waveguide 104 may not be homogeneous, resulting in a hot spot 119 in brightness in the waveguide 104. To help prevent light from escaping the waveguide 104, a circumferential polarizer 140 may be provided around the waveguide 104 as illustrated in FIG. 13B. With the polarizer 140, only a fraction of the light in the hot spot 119 escapes the waveguide 104 while most of the light is directed back into the waveguide 104 by the polarizer 140. That is, the circumferential polarizer is located around the waveguide 104 to reduce light loss from the optical hot spot in the back light waveguide 104. The hot spot 119 band brightness decreases leading to an increase in brightness of the entire unit 100. Furthermore, the high angle photon loss is decreased significantly, such as by 30 to 50%. If desired, the mechanical joint metal strip 110 and/or the index matching compound 117A shown in FIG. 12 may also be used in combination with the circumferential polarizer 140 shown in FIG. 13B.

Figure 14A:
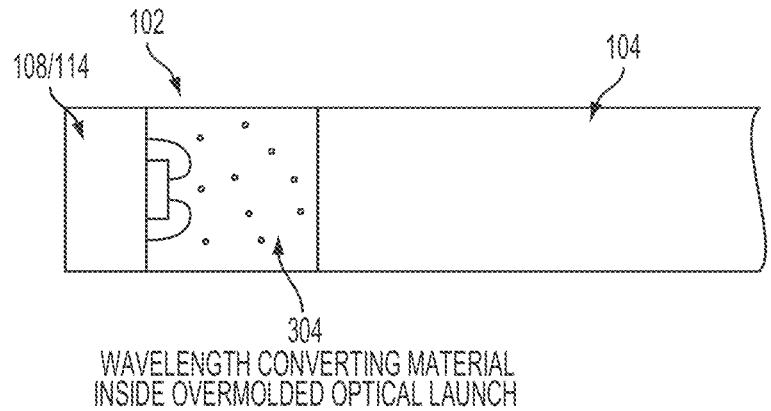
FIGS. 14A and 14B are schematic illustrations of alternative embodiments of integrated back light units with embedded dye and/or phosphor particles.
Figure 14B:
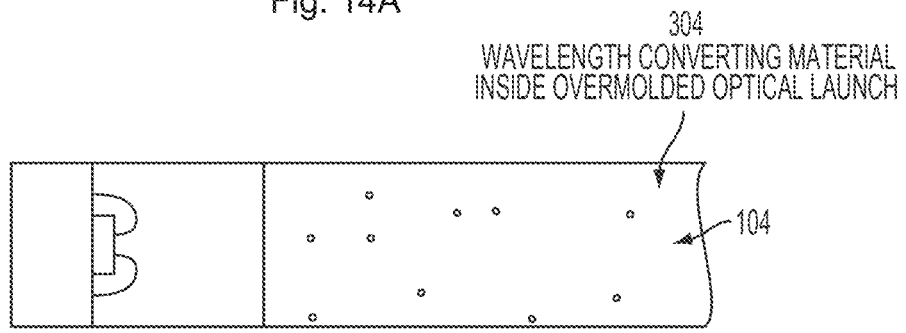

FIGS. 14A and 14B are schematic illustrations of alternative embodiments of integrated back light units with embedded dye and/or phosphor particles 304. These embodiments are similar to the embodiments illustrated in FIGS. 11A and 11B discussed above. In the embodiment illustrate in FIG. 14A, the embedded dye and/or phosphor particles 304 are located only in the optical launch 102. In the embodiment illustrated in FIG. 14B, the embedded dye and/or phosphor particles 304 are located only in the waveguide 104. As illustrated in FIG. 11B, the embedded dye and/or phosphor particles 304 may be located in both the optical launch 102 and the waveguide 104.

Figures 15A, 15B:
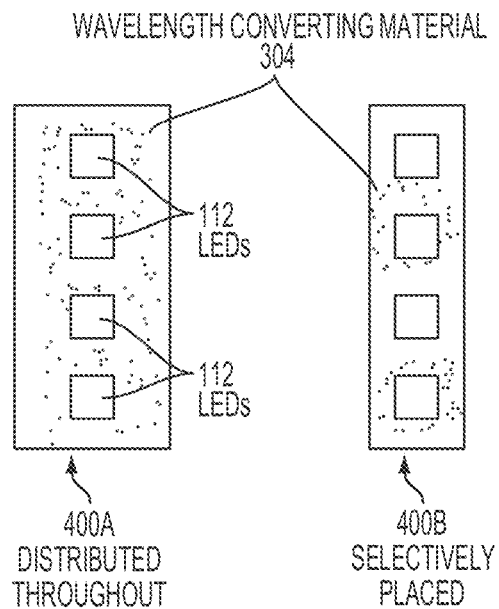
FIGS. 15A and 15B are schematic illustrations of embodiments of integrated back light units with wavelength converting materials.

FIGS. 15A and 15B are schematic illustrations of embodiments of integrated back light units 400A, 400B with wavelength converting materials, such as embedded dye and/or phosphor particles 304. In the embodiment of the integrated back light unit 400A illustrated in FIG. 15A, the dye and/or phosphor particles 304 are distributed throughout the optical launch 102, the waveguide 104 or both such that light from all of the LEDs 112 travels to the dye and/or phosphor particles 304. In the embodiment of the integrated back light unit 400B illustrated in FIG. 15B, the dye and/or phosphor particles 304 are distributed in the optical launch 102, the waveguide 104 or both such that light from selected LEDs 112 travels to the dye and/or phosphor particles 304. For example, the dye and/or phosphor particles 304 may be configured such that only light from the red LEDs 112R travels to the dye and/or phosphor particles 304. Alternatively, the dye and/or phosphor particles 304 may configured such that only light from the blue LEDs 112B or the green LEDs 112G or any combination of red, blue and or green LEDs 112R, 112B, 112G travels to the dye and/or phosphor particles 304.

Figure 16:
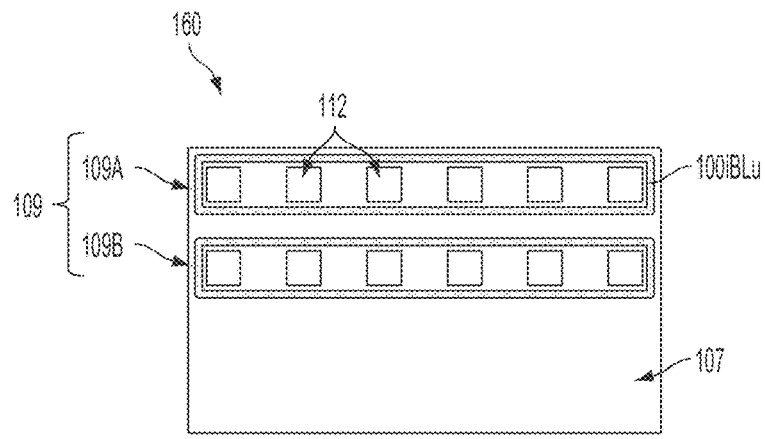
FIG. 16 is a schematic illustration of a method of making integrated back light units according to an embodiment.

FIG. 16 is a schematic illustration of a method of making integrated back light units 100 according to an embodiment. In the method illustrated in FIG. 16, multiple rows 109 (e.g. rows 109A, 109B) of LED dies 112 are first mounted (e.g., die attached and wire bonded and/or flip chip attached) on a support 107, such as an organic or inorganic substrate or panel, or a semiconductor wafer. Any of the methods illustrated in FIGS. 5A to 7E may be used to fabricate a "panel" 160 of integrated back light units 100.

After fabricating the panel 160, the panel 160 may be separated into rows of LEDs 112 (e.g., diced by saw cutting, etc.) to form individual integrated back light units 100, each having a one or more rows of LED dies 112. The units 100 may be encapsulated with the optical launch 102 and/or the waveguide 104 before or after the separation into rows with a layer of optically transparent coating. In an embodiment, the optically transparent coating has a precisely controlled thickness. Preferably, the all of the LEDs 112 on the support are gang molded with the launch and/or waveguide before the separation. If desired, all LEDs 112 on the panel or wafer 160 may be performance tested before the separation. Alternatively, each row may be performance tested separately (i.e., testing each row of LEDs at one time) before the separation and then separated and used in a back light unit 100 if it passes the test or discarded if it fails the test.

In an embodiment, the non-occupied (i.e. not occupied by LED dies 112) substrate area is minimized. This may be achieved by flip chip and monolithic integration. That is, multiple color emitters (e.g., red, green, and blue) are fabricated on single LED dies 112 which are then mounted on the support 107 to from the panel 160. In addition to red, green and blue, other color emitters may also be fabricated, such as yellow, magenta and orange or any other color as desired. Further, any number of different color dies 112 may be mounted on the support 107, such as 2 different colors, such as 3 different colors, such as 4 different colors, such as 5 different colors, such as 6 different colors, etc. Additionally, in another embodiment, plural single color LED dies 112 are fabricated and then mounted on the support 107. For example, individual red, green and blue LED dies 112R, 112B, 112G may be separately fabricated and mounted on the support 107. In an embodiment, greater than 90%, such as 91-99%, such as 92-95%, of the light emitting surface of the panel 160 is occupied by (covered by) LEDs 112. A large number of closely spaced multicolored small LEDs reduces color separation and helps achieve uniform color balance. That is, use of a large number of closely spaced multicolored small LEDs results in improved color uniformity over conventional light bars which include only a few, large LEDs.

In another embodiment, panel 160 and the individual units 100 contain flip chip and wire bonded LED dies 112. In other words, some dies 112 (e.g. back emitting dies 112) are flip chip bonded in the unit 100, while other dies 112 (e.g. front or top emitting dies 112) are wire bonded in the unit 100.

Figure 17A:
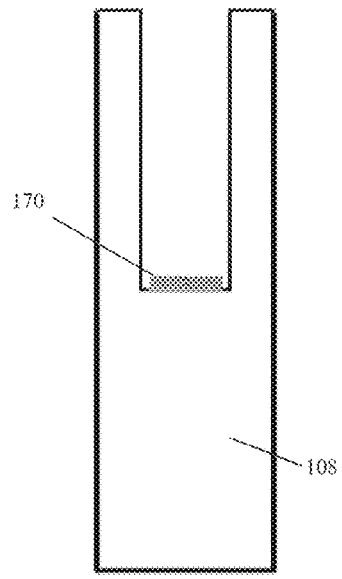
FIGS. 17A-17C are schematic illustrations of embodiments of electrical connections for an integrated back light unit.
Figure 17B:
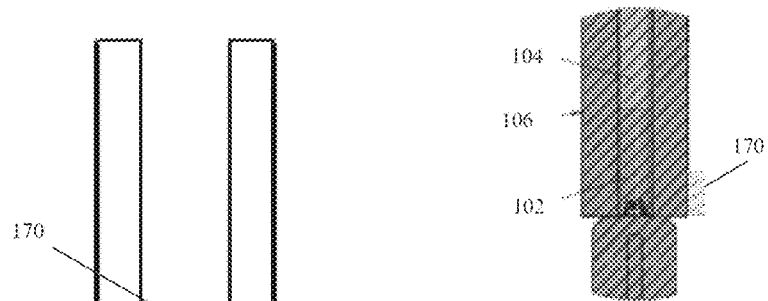
Figure 17C:
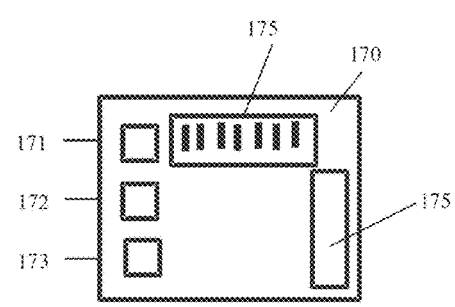

FIGS. 17A-17C are illustrate embodiments of electrical connections for an integrated back light unit 100. In a first embodiment illustrated in FIG. 17A, the support 108 includes a "flex" circuit 170 which is integrated into the support 108. For example, the circuit 170 may be located in the interstice 132 of the support below the LED die 112.

In the second embodiment, illustrated in FIG. 17B, the flex circuit 170 is mounted to any one of the three surfaces of the integrated back light unit 100 that does not face the light waveguide 104. The surface attachment process could be accomplished with eutectic solder reflow, a conductive epoxy connection, laser welding, gold stub bonding or with anisotropic conductive film.

As illustrated in FIG. 17C, the flex circuit provides electrical contacts 175 to which the leads/contacts 130 of integrated back light unit 100 can be electrically connected. Further, the flex circuit may include one or more temperature sensors 171, electrostatic discharge input protection diodes 172 and/or photo-sensors 173 and/or monolithic LED driver integrated circuits 174. A flex circuit 170 with such components increases the capability and functionality of the integrated back light unit 100.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making an integrated back light unit, comprising:
    providing a light emitting diode (LED) assembly comprising a support having a top surface and a plurality of LEDs disposed on the top surface of the support, wherein the plurality of LEDs includes multiple rows of LEDs;
    encapsulating the plurality of LEDs disposed on the support with transparent material which forms an optical launch, wherein the plurality of LEDs in the multiple rows are gang molded by a single continuous layer of the transparent material that encapsulates each of the plurality of LEDs in the LED assembly;
    separating the assembly into multiple rows of encapsulated LEDs after the step of encapsulating the plurality of LEDs, by dicing through the single continuous layer of the transparent material and through the support to provide diced structures, wherein each of the diced structures comprises a separated row of encapsulated LEDs located on a diced portion of the support and encapsulated by a diced portion of the transparent material;
    providing a light guiding plate having a light-receiving end surface and a major surface that is perpendicular to the light-receiving end surface and configured to emit light through the major surface upon receiving light through the light-receiving end surface; and
    forming the integrated back light unit by optically coupling the light guiding plate to a first one of the diced structures containing the separated row of the encapsulated LEDs by taping the light-receiving end surface of the light guiding plate to the first one of the diced structures, such that the light-receiving end surface of the light guiding plate is parallel to the top surface of the diced portion of the support within the one of the diced structures.

2. The method of claim 1, further comprising testing the plurality of LEDs prior to the step of separating.

3. The method of claim 2, wherein the step of testing comprises testing each row of LEDs at one time.

4. The method of claim 1, wherein greater than 90% of a surface of the support comprises LEDs.

5. The method of claim 4, wherein 91-99% of the surface of the support comprises LEDs.

6. The method of claim 1, wherein providing a light emitting diode (LED) assembly comprises flip chip bonding back emitting LEDs to the support and wire bonding front emitting LEDs to the support.

7. The method of claim 1, wherein the plurality of LEDs comprises a plurality of different color LEDs.

8. The method of claim 1, wherein the support comprises a lead frame.

9. The method of claim 1, wherein the support comprises a molded lead frame.

10. The method of claim 9, wherein providing a light emitting diode (LED) assembly comprises wire bonding LEDs to leads of the molded lead frame.

11. The method of claim 1, further comprising electrically connecting at least a first row of the encapsulated LEDs to a circuit board.

12. The method of claim 11, wherein the integrated back light unit comprises at least the first row of the encapsulated LEDs and the light guiding plate located on the circuit board.

13. The method of claim 1, wherein the support comprises a printed circuit board.

14. The method of claim 1, further comprising optically coupling each of the separated rows of encapsulated LEDs to a respective light guiding plate after dicing to provide the plurality of integrated back light units.

15. The method of claim 1, wherein:
    optically coupling the light guiding plate to the first one of the diced structures containing the separated row of the encapsulated LEDs by taping comprises taping the light-receiving end surface of the light guiding plate to the diced portion of the transparent material of the first one of the diced structures using a tape.

16. The method of claim 15, wherein:
    the single continuous layer of the transparent material includes a planar top surface that is perpendicular to the normal direction; and
    the top surface of the support defines a normal direction that is perpendicular to the top surface of the support.

17. The method of claim 16, wherein:
    the diced portion of the support includes a top surface that is a portion of the top surface of the support prior to dicing;
    the diced portion of the transparent material includes a transparent top surface that is a remaining portion of the planar top surface of the single continuous layer of the transparent material and that is parallel to the top surface of the diced portion of the support; and
    each LED in the separated row of encapsulated LED is configured to provide light emission through the transparent top surface along a direction that is perpendicular to the top surface of the diced portion of the support.

18. The method of claim 17, wherein coupling the light guiding plate to a row of the encapsulated LEDs within one of the diced structures by taping comprises taping the light-receiving end surface of the light guiding plate to the transparent top surface of the diced portion of the transparent material within the one of the diced structures.

19. The method of claim 18, wherein:
    the major surface of the light guiding plate is perpendicular to the top surface of the diced portion of the transparent material within the one of the diced structures, and to the top surface of the diced portion of the support within the one of the diced structures; and the light-receiving end surface of the light guiding plate is parallel to the top surface of the diced portion of the transparent material within the one of the diced structures.

20. The method of claim 19, wherein major surfaces of the tape are parallel to the light-receiving end surface of the light guiding plate, and are parallel to the transparent top surface of the diced portion of the transparent material within the one of the diced structures, and the row of the encapsulated LEDs within one of the diced structures is configured to emit light through the tape along a direction that is perpendicular to the surfaces of the tape.

21. The method of claim 19, further comprising attaching a base plate having a respective major surface to an assembly of the one of the diced structures and the light guiding plate, wherein the based plate is disposed on an opposite side of the major surface of the light emitting plate that is configured to emit light, and the major surface of the base plate is parallel to the major surface of the light guide plate.

22. The method of claim 21, wherein the major surface of the base plate is perpendicular to the light-receiving end surface of the light guiding plate, to the top surface of the diced portion of the transparent material within the one of the diced structures, and to the top surface of the diced portion of the support within the one of the diced structures.

23. The method of claim 19, wherein the diced portion of the transparent material within the one of the diced structures constitutes an optical launch that mates the light emitting guide.

24. The method of claim 23, further comprising disposing a reflective material over side surfaces of the optical launch, wherein the side surfaces extend generally along a direction that is perpendicular to the light-receiving end surface of the light guiding plate, to the top surface of the diced portion of the transparent material within the one of the diced structures.

* * * * *